(12) United States Patent
Hong

(10) Patent No.: US 6,331,748 B1
(45) Date of Patent: Dec. 18, 2001

(54) DRIVING CIRCUIT OF A PIEZO-CERAMIC TRANSFORMER CAPABLE OF CONTROLLING AN INPUT VOLTAGE AND A DIMMING CONTROL METHOD THEREOF

(75) Inventor: Soongil Hong, Kyonggi-Do (KR)

(73) Assignee: Dongil Technology Ltd., Kyonggi-do (KR)

( * ) Notice: Subject to any disclaimer, the term of this patent is extended or adjusted under 35 U.S.C. 154(b) by 0 days.

(21) Appl. No.: 09/557,901

(22) Filed: Apr. 21, 2000

Related U.S. Application Data

(63) Continuation-in-part of application No. 09/268,983, filed on Mar. 16, 1999, now abandoned.

(30) Foreign Application Priority Data

Dec. 21, 1998 (KR) ................................................ 98-56719

(51) Int. Cl.[7] .................................................. H01L 41/107
(52) U.S. Cl. ........................................................... 310/318
(58) Field of Search ............................. 310/316.01, 359, 310/316.02, 318

(56) References Cited

U.S. PATENT DOCUMENTS

| | | | |
|---|---|---|---|
| 5,705,879 | 1/1998 | Abe et al. | 310/359 |
| 5,739,622 | 4/1998 | Zaitsu | 310/316.01 |
| 5,739,679 | * 4/1998 | Takehara et al. | 323/299 |
| 5,866,969 | 2/1999 | Shimada et al. | 310/318 |
| 5,886,477 | 3/1999 | Honbo et al. | 310/318 |
| 5,886,514 | 3/1999 | Iguchi et al. | 323/299 |
| 5,923,542 | 7/1999 | Sasaki et al. | 363/16 |
| 5,942,835 | * 8/1999 | Furuhashi et al. | 310/316.01 |
| 6,016,052 | * 1/2000 | Yaughn | 323/355 |

FOREIGN PATENT DOCUMENTS

| | | | |
|---|---|---|---|
| 61-152165 | * 7/1986 | (JP) | 310/316.01 |
| 10-75575 | * 3/1998 | (JP) | 310/316.01 |

* cited by examiner

Primary Examiner—Thomas M. Dougherty
(74) Attorney, Agent, or Firm—Darby & Darby

(57) ABSTRACT

A fixed frequency driving circuit of a piezo-ceramic transformer capable of controlling an input voltage. The driving circuit includes a lamp; a PCT(Piezo-Ceramic Transformer) for driving the lamp; a PCT driving circuit for driving the PCT; a voltage doubler rectifier for rectifying an output voltage; a summing & error amplifying circuit for outputting by summing a dimming voltage and the output voltage; a charge pump circuit for maintaining zero voltage switching and reducing the switching loss; a temperature compensated VCO for compensating the temperature characteristics of PCT, and impact, etc. in the neighborhood; a phase detector for comparing the phase of the input and output signal of the PCT; a modulator capable of continuously obtaining an amplitude of a first harmonic frequency component when the input voltage is changed from Vmin to Vmax by controlling a duty ratio provided to a driver connected to the PCT according to the output signals of the phase detector and the summing & error amplifier.

9 Claims, 5 Drawing Sheets fr : Resonant frequency of PCT at room temperature, 25℃
fr1 : Resonant frequency of PCT at temperature, 25℃ +△T
fr2 : Resonant frequency of PCT at temperature, 25℃ -△T
f : Driving frequency by the VCO at room temperature, 25℃
f1 : Driving frequency by the VCO at temperature, 25℃ +△T
f2 : Driving frequency by the VCO at temperature, 25℃ -△T

US 6,331,748 B1

DRIVING CIRCUIT OF A PIEZO-CERAMIC TRANSFORMER CAPABLE OF CONTROLLING AN INPUT VOLTAGE AND A DIMMING CONTROL METHOD THEREOF

This Application is a Continuation-in-Part of 09/268,983 filed Mar. 16, 1999 now abandoned.

BACKGROUND OF THE INVENTION

1. Field of the Invention

The present invention is related to a driving circuit of a piezo-ceramic transformer and a dimming control method thereof, more particularly, to a driving circuit of a piezo-ceramic transformer capable of controlling an input voltage and a dimming control method thereof without a DC—DC converter.

2. Description of the Prior Art

Technology for making a relatively thin and small notebook computer with a LCD (Liquid Crystal Display) is being developed. It is therefore desirable to develop a DC-AC inverter that is relatively small and has a relatively high efficiency to use as an LCD backlight.

However, a magnetic transformer used with a conventional DC-AC inverter for a LCD backlight has limits for making it small in size and obtaining a high efficiency.

Although an inverter using a PCT (Piezo-Ceramic Transformer) for improving the above conventional problems has been studied for several years, it also has several problems in that the driving circuit is very complicated and another DC—DC converter is needed in order to constantly maintain an applied voltage to the PCT driving circuit because in the application circuit, an input voltage has a wide variable range.

That is, general types of the PCT being used practically are as follows:

1. a buck or boost DC—DC converter+a push-pull type inverter,
2. a DC—DC converter+a single ended quasi resonant type inverter,
3. a DC—DC converter+a half bridge type inverter,
4. a DC—DC converter+a flyback single ended quasi resonant type inverter.

Since the above types are all operated by two stage inverter, a switching device and a control circuit in every singe stage inverter must be used, thereby making the circuit very complicated.

FIG. 7 is a circuit diagram of a conventional a half bridge type inverter with a piezo-ceramic transformer.

As shown in FIG. 7, when an input voltage is changed from Vmin to Vmax, a constant voltage is made at the point A' of the circuit by the DC—DC converter and provided to transistor Q1 and Q2 for driving a PCT, as a switching device. In the circuit, the duty ratio of the transistor Q1 and Q2 are continuously controlled so that a constant voltage is applied to point C' at the input terminal of the PCT.

In the case of resonant type inverter using the magnetic transformer, a single stage inverter is adopted to drive the CCFL lamp. A wide range input line regulation may be controlled using frequency modulation. But the method of controlling frequency modulation has a critical problem in that the brightness efficiency of the lamp fluctuates by varying the driving frequency of the magnetic transformer or the PCT. As a result, even thought the electrical efficiency of the lamp is maintained at a constant value, the brightness efficiency of the lamp rapidly fluctuates with the variation of driving frequency. Because the Q(Quality factor) value of the PCT is much higher than the magnetic transformer, the frequency modulation method to drive the PCT results in higher brightness fluctuation than to drive the magnetic transformer.

SUMMARY OF THE INVENTION

The present invention avoids the complexity of conventional control circuits. Although several semiconductor companies use control circuits which are integrated into a single chip as a single stage DC-AC inverter such devices disadvantageously require the use of several switching devices.

To solve the aforementioned problems, an object of the present invention, FIG. 1, is to provide a fixed frequency driving circuit of a piezo-ceramic transformer which is capable of wide range input line regulation using a Pulse Width Modulator (PWM) so as to avoid the problems in using the controlling method by frequency modulation described above.

Another object of the present invention is to provide a temperature compensated Voltage Controlled Oscillator (VCO) to adjust the temperature characteristics of VCO and PCT so that they are substantially the same and ensure that the efficiency of the PCT is not deteriorated.

Another object of the invention is to provide a phase detector 5 which compares the input and output signals of the PCT so that the circuit is operated at the driving frequency(f) by the VCO's oscillation frequency, f>fr, although the resonant frequency(fr) of the PCT and driving frequency(f) by the VCO are changed by a temperature, impact, etc., in the neighborhood.

To accomplish the above objects, this invention relates to a fixed frequency driving circuit of a piezo-ceramic transformer including a lamp 12; a PCT(Piezo-Ceramic transformer) 11 for driving the lamp 12; a charge pump circuit 9, a circuit for driving the PCT; a voltage doubler rectifier 1 for rectifying an output voltage; a summing & error amplifying circuit 2 for summing a dimming voltage and the output voltage of the voltage doubler; a phase detector 5 for comparing the phase of the input and output signals of the PCT; a PWM modulator 8 for continuously maintaining a constant amplitude of a first harmonic component when the input voltage is changed from Vmin (Minimum input voltage) to Vmax(Maximum input voltage).

The present invention is also directed to a dimming control method for a driving circuit of a piezo-ceramic transformer by determining a duty ratio Dx at an input voltage Vx for producing the maximum output current from the input voltage Vx, and providing a current having a desired brightness by reducing the value of Dx for dimming.

DETAILED DESCRIPTION OF THE PREFERRED EMBODIMENT

Figure 1:
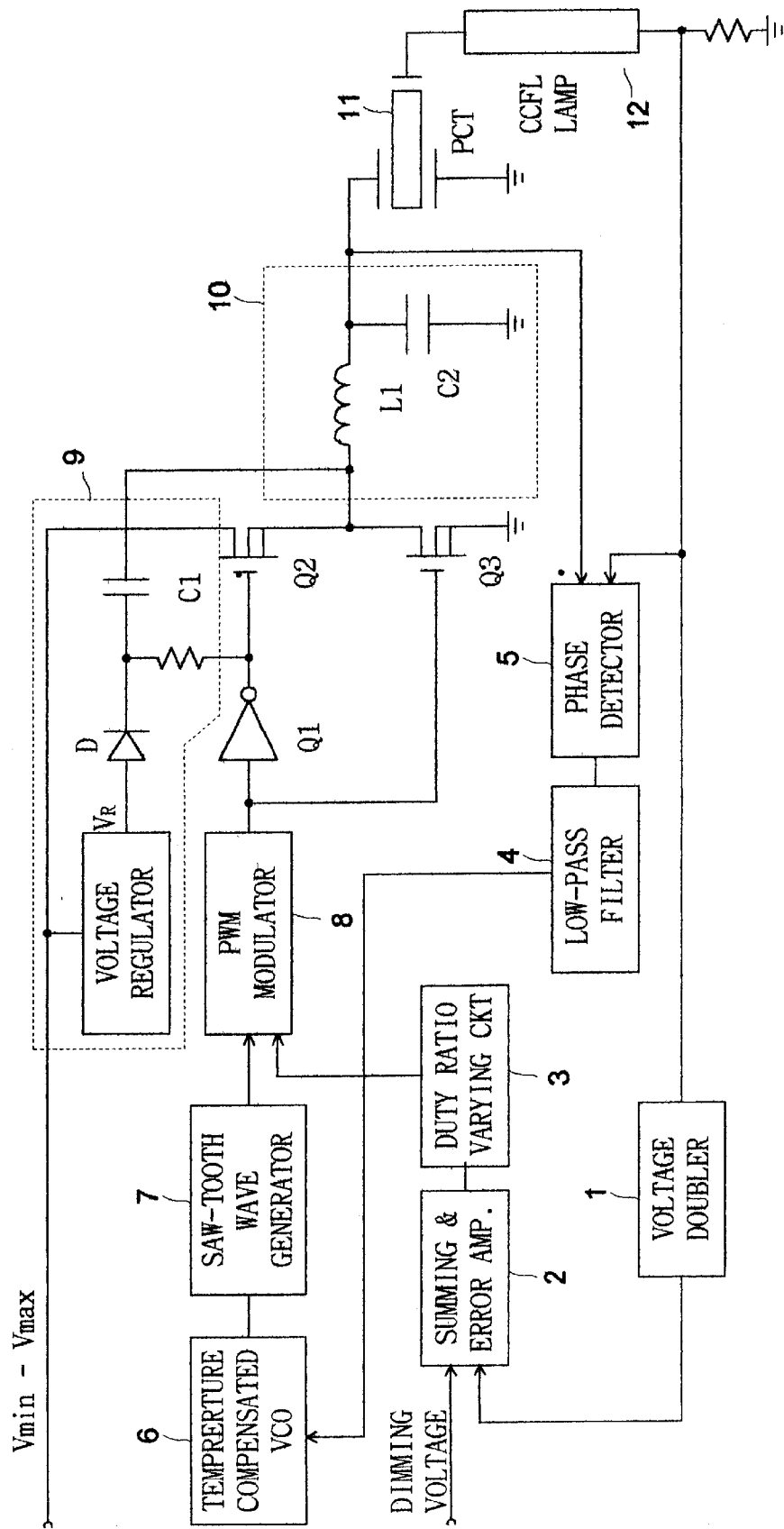
FIG. 1 is a block diagram according to the present invention.

The above and other objects, features and other advantage of the present invention will be more clearly understood from the following detailed description taken in conjunction with the accompanying drawings. In the drawings the same reference numerals depict the same parts.

FIG. 1 is a block diagram according to the present invention.

As shown in FIG. 1, the driving circuit includes a voltage doubler rectifier 1 for rectifying an output voltage, a summing & error amplifier 2 for producing an output signal by summing a dimming voltage and an output voltage, a duty ratio varying circuit 3 for dimming and duty ratio control, and a phase detector 5 for detecting a relative phase in the input and output signal of the PCT.

The driving circuit also includes a temperature compensated Voltage Controlled Oscillator (VCO) 6 for providing the driving frequency from an output signal of the phase detector 5, a saw-tooth wave generator 7, a pulse width modulator (PWM) 8 for varying the duty ratio according to the output of the duty ratio varying circuit 3 and the saw-tooth wave generator 7. A charge pump circuit 9, a piezo-ceramic transformer 11, and a lamp 12.

Hereinafter, the PCT driving circuit will be described in detail with reference to FIG. 2.

The PCT driving circuit comprises a charge pump circuit, three transistors, Q1, Q2 and Q3 and an LC filter. Although the basic construction of FIG. 2 is similar to that of FIG. 7, the ON/OFF control method of transistors Q2 and Q3 are different. Furthermore, in FIG. 7 a driving transformer must be used, whereas the driving transformer must be used, whereas the driving transformer has been eliminated in FIG. 2.

Figure 7:
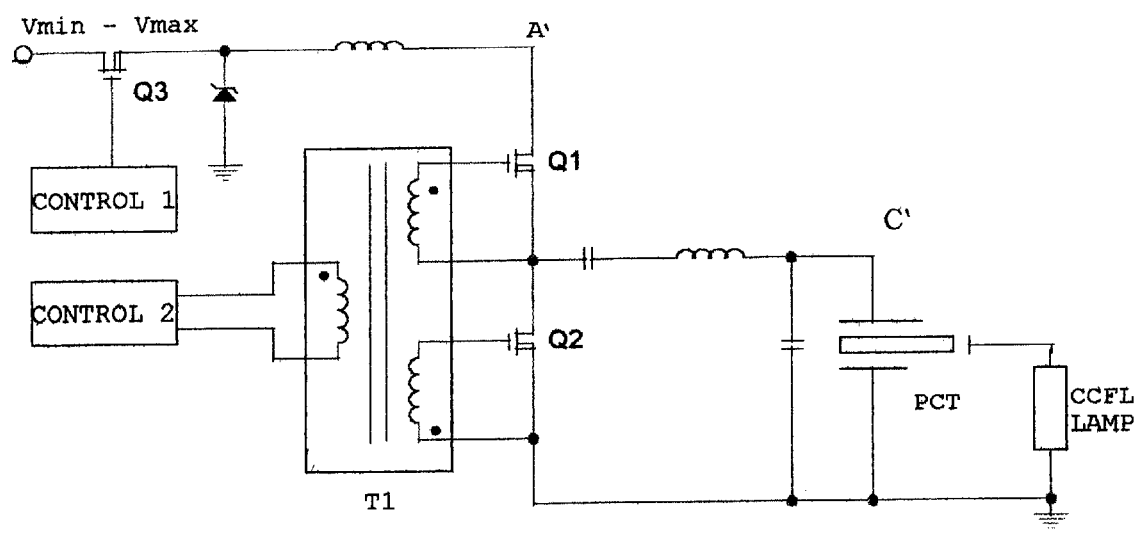
FIG. 7 is a prior art circuit diagram for driving a piezo-ceramic transformer.

Also, in FIG. 7, a constant voltage must be provided at point A' by controlling the input voltage. However, according to the construction of the control circuit of the present invention, although a variable input voltage at point A is provided, a constant voltage is always provided at point C.

Figure 2:
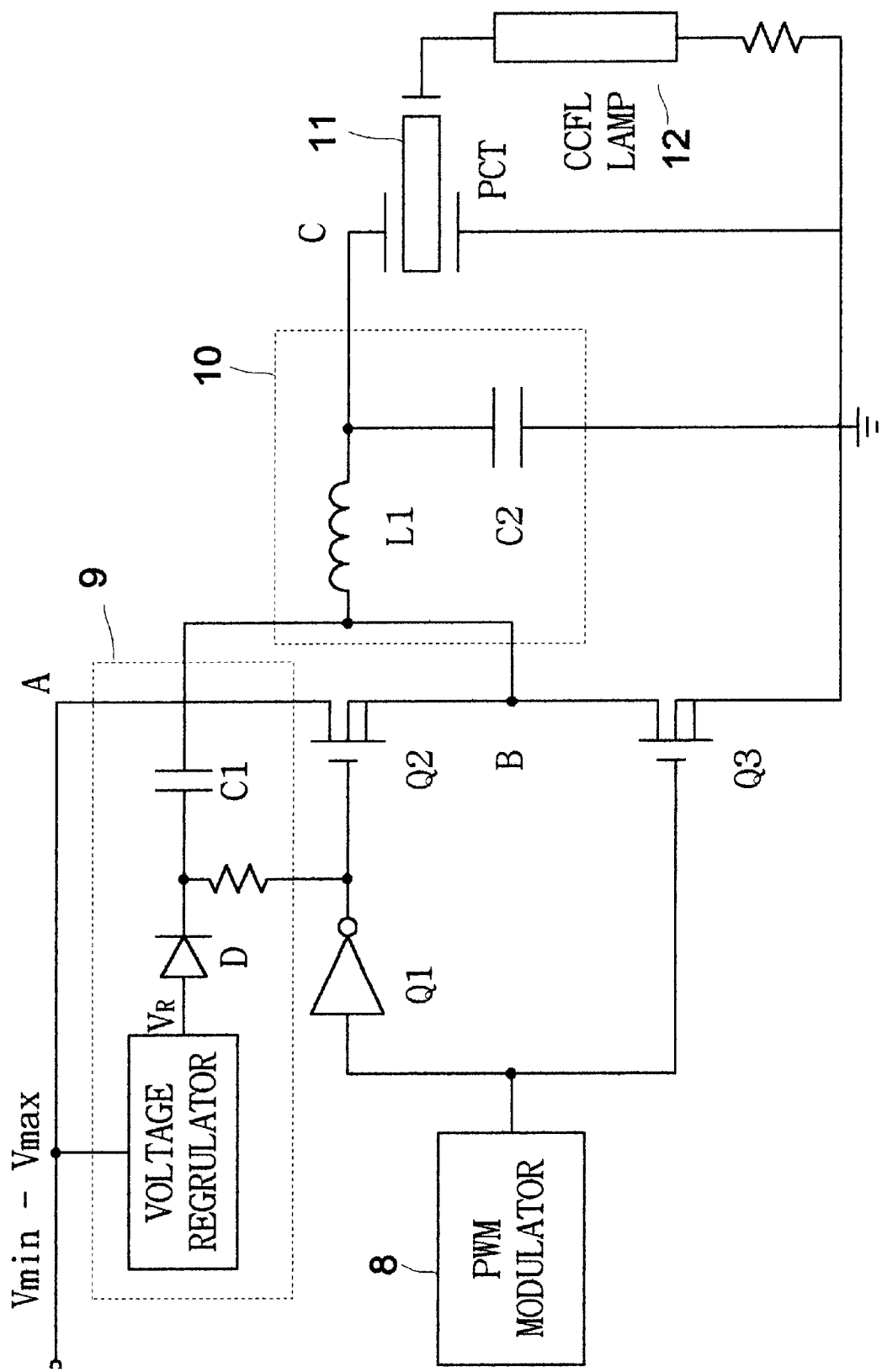
FIG. 2 is a circuit diagram of the PCT driving circuit in FIG. 1.

In FIG. 2, the ON/OFF operation of transistors Q2 and Q3 will be described in detail. When transistor Q2 is turned ON at each one period, the transistor Q3 is necessarily turned ON at another one period, so that the duty ratio of the transistor Q2 and Q3 due to the variation of the input voltage are different. Furthermore, in this circuit, when transistors Q1 and Q3 are ON, capacitor C1 is charged to a voltage ($V_R$–$V_D$) through diode D. When transistors Q1 and Q3 are turned OFF, the gate voltage of transistor Q2 is pulled to the above voltage, and transistor Q2 is turned ON. Since the input impedance of transistor Q2 is very high, the charged value across C1 is maintained long enough to turn transistor Q2 completely ON. Also, capacitor C1 is selected to be large enough to sustain this charge. In general, when the transistor Q2 is improperly driven or the duty ratio is very narrow, the zero-voltage switching is lost and there is an increased switching loss of transistor Q2. The charge pump circuit maintains the zero-voltage switching and reduces the switching loss of transistor Q2 even though the duty ratio is narrower than 5% in combination with the phase-locked loop operation.

Figure 3:
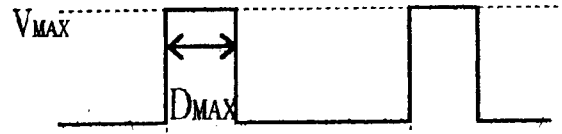
FIG. 3 is a waveform at point of B according to the input voltage in FIG. 1.
Figure 4:
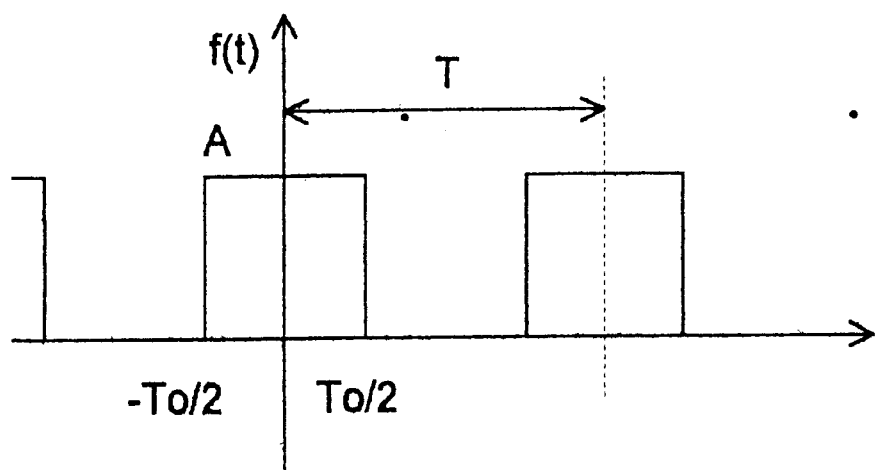
FIG. 4 is an outline view for expanding the waveform in FIG. 3 by Fourier Series.

The waveform at point B is shown in FIG. 3 and FIG. 4.

The circuit is controlled so that when the input voltage is high, the duty ratio of transistor Q2 is small, and when the input voltage is low, the duty ratio of transistor Q2 is large. Accordingly, the following theory is inferred.

The waveform of FIG. 3 can be expanded as a Fourier series by referring to FIG. 4, as follows.

$$F[f(t)] = \frac{1}{2}a_0 + \sum_{k=0}^{\infty}(a_k \cos k\omega_0 t + b_k \sin k\omega_0 t)\left(\omega_0 = \frac{2\pi}{T}\right) \quad (1)$$

$$a_k = \frac{2}{T}\int_{-\frac{T}{2}}^{\frac{T}{2}} f(t)\cos k\omega_0 t \, dt$$

$$= \frac{2}{T}\int_{-\frac{T_0}{2}}^{\frac{T_0}{2}} V \cos k\omega_0 t \, dt$$

$$= \frac{2}{T}\left[\frac{V}{k\omega_0}\sin k\omega_0 t\right]_{-\frac{T_0}{2}}^{\frac{T_0}{2}}$$

$$= \frac{4V}{Tk\omega_0}\sin k\omega_0 \frac{T_0}{2}$$

$$= \frac{2V}{k\pi}\sin k\frac{T_0}{T}\pi \left(\text{sinc}\, x = \frac{\sin \pi x}{\pi x}\right)$$

$$= \frac{2V}{k\pi}\frac{\frac{T_0}{T}}{\frac{T_0}{T}}\sin k\frac{T_0}{T}\pi$$

$$= 2V\frac{T_0}{T}\text{sinc}\, n\frac{T_0}{T}\pi$$

$b_k = 0 [\because f(t) \text{ is an even function}]$

In formula (1), $$a_0 = \frac{2V}{T}T_0 \quad (2)$$

$$a_1 = \frac{2V}{\pi}\sin\frac{T_0}{T}\pi$$

$$a_2 = \frac{2V}{2\pi}\sin 2\frac{T_0}{T}\pi$$

$$a_k = \frac{2V}{k\pi}\sin k\frac{T_0}{T}\pi$$

The input voltage V is changed from Vmin to Vmax. When the input voltage is changed to Vmin, the duty ratio is controlled to be Dmin(Dmin: duty ratio at input voltage Vmin which is max. 50%), and when the input voltage is changed Vmax, the duty ratio is controlled in order to be the same magnitude of the first harmonic component i.e. a1 (min)=a1 (max), regardless of the input voltage.

That is, when the input voltage varies between Vmin and Vmax, a first harmonic component having a constant amplitude can always be obtained, so that input line regulation is possible. That is expanded as the following formula (2).

$$a_1(\min) = \frac{2V_{\min}}{\pi}\sin D\min\pi \quad (D\min: \text{Duty ratio, when } V = V\min)$$

$$a_1(\max) = \frac{2V_{\max}}{\pi}\sin D\max\pi \quad (D\max: \text{Duty ratio, when } V = V\max)$$

The equation may be generally represented as $$a_{1x} = \frac{2V_x}{\pi}\sin D_x\pi$$

Here, Dx at $\alpha_1(min)=\alpha_{1x}$ is $$\frac{2V_{min}}{\pi}\sin Dmin\pi = \frac{2V_x}{\pi}\sin D_x\pi \quad (3)$$

$$\therefore D_x = \left[\sin^{-1}\frac{V_{min}}{V_x}\sin Dmin\pi\right]/\pi$$

Equation (3) above is a general formula for computing a duty ratio in which the amplitude is the same amplitude of the first harmonic frequency component obtained by the voltage of Vmin and Dmin at an input voltage Vx.

Table 1 below is the duty ratio at several input voltages.

TABLE 1

Duty ratio at input voltage Vx.

| Vx | DUTY RATIO | | |
|---|---|---|---|
| 8V | 50% | 28% | 16.9% |
| 10V | 29.5% | 21.2% | 13.3% |
| 12V | 23.2% | 17.2% | 10.9% |
| 14V | 19.3% | 14.6% | 9.4% |
| 16V | 16.6% | 12.6% | 8.2% |
| 18V | 14.6% | 11.1% | 7.2% |
| 20V | 13.0% | 10% | 6.5% |
| $a_{1(rms)}$ | 3.6V | 2.78V | 1.82V |

In FIG. 2, a duty ratio of the PWM modulator 8 is controlled so that the waveform at point B is 8V: 50%, 10V: 29.5%, ... 20V: 13% and when the first harmonic frequency component is passed by a LC filter 10, a sine wave is always obtained as al(x)=3.6Vrms at point C.

According to the present invention, without the use of a DC—DC converter, a single stage DC-AC inverter can be designed capable of controlling a wide range input line regulation.

A dimming method in accordance with the present invention will now be described.

As mentioned above, in the circuit of the present invention, the duty ratio is controlled to obtain a maximum output current due to the variation of the input voltage. First, the duty ratio Dx is determined to obtain the maximum output current at a voltage Vx and then the value of Dx is reduced for dimming to the desired brightness.

In FIG. 1, the voltage doubler rectifier 1 and the summing & error amplifier 2 are designed so that the Dx of the PWM modulator 8 is reduced by the signal of the duty ratio varying circuit 3.

Figure 5:
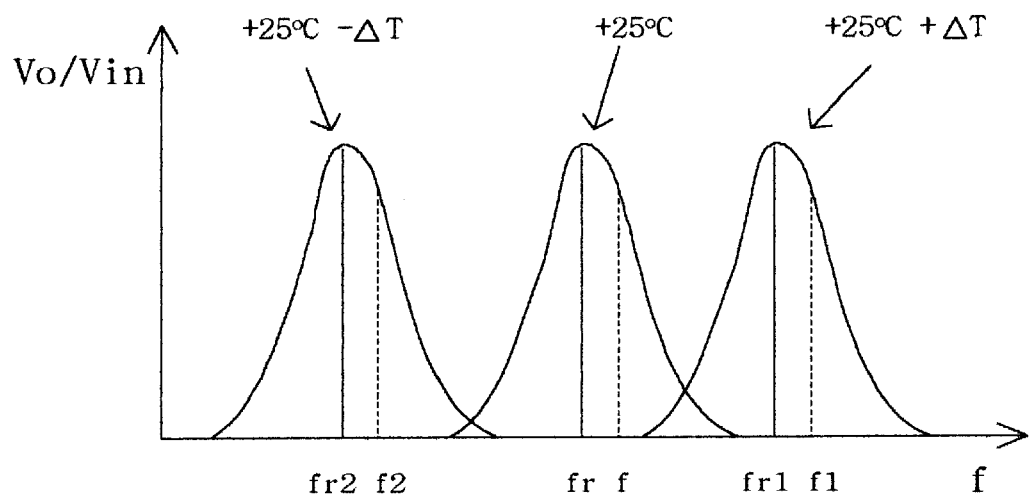
FIG. 5 is a characteristic curve according to an input and output boosting ratio to the frequency, temperature of a PCT.
Figure 6:
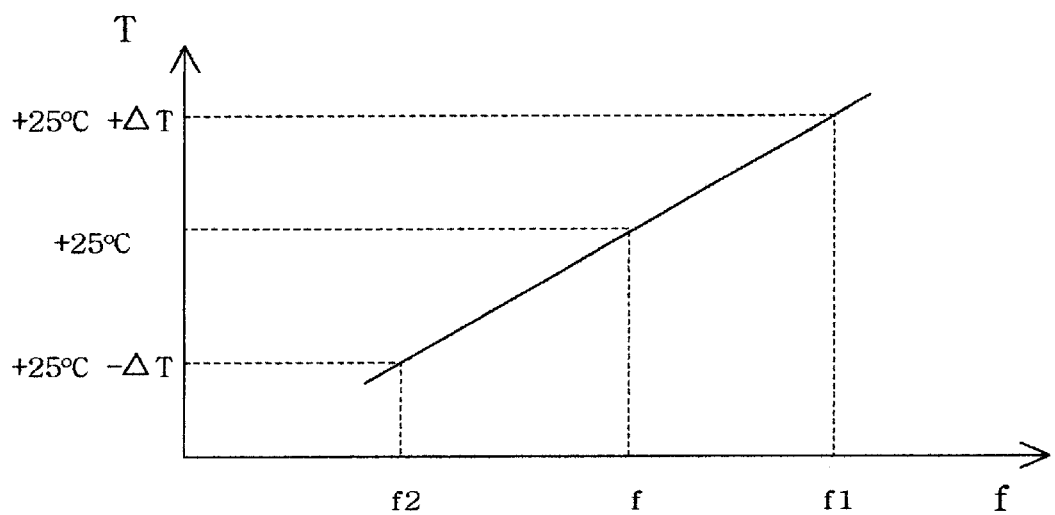
FIG. 6 is a temperature characteristic of the VCO.

In FIG. 5 fr is the resonant frequency of the PCT, and f is the driving frequency by the VCO's oscillating frequency. If the PCT is operated at the driving frequency by the VCO, which is slightly low compared to the resonant frequency(fr) of the PCT by the temperature characteristic of the VCO and PCT, impact, etc., in the neighborhood, the efficiency of the PCT is deteriorated. So, the driving frequency by the VCO must always be a little higher than the resonant frequency of the PCT.

For this reason, in FIG. 1, a phase detector 4 is provided for comparing the input and output signals of the PCT. Although the VCO is controlled by the output of phase detector, if the temperature characteristic of VCO and PCT is not substantially the same, the PCT is not operated in the driving frequency by the VCO to be able to get the maximum efficiency. To solve this problem, the driving circuit in accordance with the present invention includes a temperature compensated VCO 6, a phase detector 5, and a low-pass filter 4. This circuit is operated in phase locked loop to tract and search a driving frequency by the VCO to be able to realize a maximum efficiency. As a result, although the resonant frequency(fr) of the PCT and driving frequency(f) by the VCO change due to variations of temperature, impact, etc., in the neighborhood, the PCT is always operated by a driving frequency that is greater than the resonant frequency (fr).

Whereas this invention is here illustrated and described with reference to an embodiment thereof presently contemplated as the best mode of carrying out such invention in actual practice, it is to be understood that various changes may be made in adapting the invention to different embodiments without departing from the broader inventive concepts disclosed herein and comprehended by the claims that follow.

What is claimed is:

1. A fixed frequency driving circuit for a piezo-ceramic transformer capable of controlling an input voltage, comprising:

a piezo-ceramic transformer driving circuit electrically connected to drive the piezo-ceramic transformer, said piezo-ceramic transformer driving circuit having an input and an output;

a voltage doubler rectifier electrically connected to the piezo-ceramic transformer for rectifying an output voltage of the piezo-ceramic transformer, said voltage double having an output;

a summing and error amplifier electrically connected to the output of the voltage doubler rectifier for outputting a sum voltage of a dimming voltage and an output voltage of the voltage doubler rectifier;

a phase detector electrically connected between the input and output of the piezo-ceramic transformer for detecting a phase between the input and output signals of the piezo-ceramic transformer;

a temperature compensated voltage controlled oscillator for compensating temperature characteristics for the piezo-ceramic transformer, the temperature compensated voltage controlled oscillator being electrically connected to the output of the phase detector;

a charge pump circuit electrically connected to the input of the piezo-ceramic transformer driving circuit for maintaining zero voltage switching and reducing switching loss of a switching element in combination with a phase-locked loop operation produced by the voltage controlled oscillator and phase detector; and a modulator electrically connected to the input of the piezo-ceramic transformer driving circuit for continuously producing an amplitude of a first harmonic frequency component when the input voltage is changed from a minimum voltage to a maximum voltage by controlling a duty ratio provided to the piezo-ceramic transformer driving circuit according to output signals from the phase detector and the summing and error amplifier.

2. A fixed frequency driving circuit in accordance with claim 1, wherein the piezo-ceramic transformer driving circuit comprises:

three transistors, including a first transistor connected in series to a second transistor and a third transistor connected in parallel with the first and second transistors; and an LC filter connected between the second and third transistors.

3. A fixed frequency driving circuit in accordance with claim 1, wherein the charge pump circuit reduces switching loss even when the duty ratio is less than approximately 5%.

4. A fixed frequency driving circuit in accordance with claim 1, wherein the phase detector controls the phase so that a driving frequency by the voltage controlled oscillator's oscillation frequency is greater than a resonant frequency of the piezo-ceramic transformer, when the resonant frequency of the piezo-ceramic transformer varies due to an environment condition.

5. A fixed frequency driving circuit in accordance with claim 4, wherein the environment condition is at least one of temperature and impact.

6. A method for using the driving circuit in accordance with claim 1, comprising the step of restricting a driving frequency using the temperature compensated voltage controlled oscillator so that the driving frequency is greater than a resonant frequency when the resonant frequency of the piezo-ceramic transformer is shifted by an environment condition.

7. A method in accordance with claim 6, wherein the environment condition is at least one of temperature and impact.

8. A dimming control method of a driving circuit of a piezo-ceramic transformer comprising the steps of:

determining a duty ratio at an input voltage for producing a maximum output current at the input voltage; and providing a current producing a desired brightness by reducing the duty ratio at the input voltage for dimming while substantially maintaining brightness efficiency;

wherein the duty ratio is a required ratio of switch turn ON time to a period of the input voltage, and an amplitude of the duty ratio is equivalent to an amplitude of a first harmonic frequency component.

9. A method in accordance with claim 8, wherein the amplitude of the duty ratio is determined using a minimum input voltage and the duty ratio value based on the input voltage.

* * * * *